United States Patent
Liang et al.

(10) Patent No.: US 6,245,148 B1
(45) Date of Patent: Jun. 12, 2001

(54) SOG DISPENSING SYSTEM AND ITS CONTROLLING SEQUENCES

(75) Inventors: Mike Liang; Peter Baw; John Chiu; Bryan Chang, all of Hsin-Chu (TW)

(73) Assignee: Mosel Vitelic Inc., Hsin-Chu (TW)

( * ) Notice: Subject to any disclaimer, the term of this patent is extended or adjusted under 35 U.S.C. 154(b) by 0 days.

(21) Appl. No.: 09/300,432

(22) Filed: Apr. 28, 1999

(30) Foreign Application Priority Data

Jan. 11, 1999 (TW) ................................................ 88100300
Jan. 11, 1999 (TW) ................................................ 88100301

(51) Int. Cl.[7] ........................... B05C 11/10; B05C 11/11; B67D 5/08; B05B 1/00; H01L 21/00
(52) U.S. Cl. ........................ 118/683; 118/667; 118/684; 118/692; 118/694; 118/64; 118/69; 427/240; 427/96; 222/64; 222/146.1; 222/373; 438/758
(58) Field of Search ........................ 118/683, 663, 118/667, 677, 678, 684, 688, 692, 693, 694, 710, 56, 64, 69, 320; 427/96, 240; 222/1, 64, 108, 145.2, 146.1, 251, 335, 373, 65, 66, 67, 68; 438/758, 780

(56) References Cited

U.S. PATENT DOCUMENTS 4,886,012 * 12/1989 Ikeno et al. ........................... 118/667
5,433,344 * 7/1995 Fulton et al. ........................... 222/65
5,857,619 * 1/1999 Huang et al. ........................... 239/11

* cited by examiner

*Primary Examiner*—Richard Crispino
*Assistant Examiner*—J. A. Lorengo
(74) *Attorney, Agent, or Firm*—Bacon & Thomas

(57) ABSTRACT

The present invention relates to a SOG (Spin-On-Glass) dispensing system and its controlling sequences and, more particularly, to a SOG dispensing system allowing for continuous production and its controlling sequences According to the present invention, a buffer tank, whose wall is set a plurality of level sensors at different level heights, is connected between a source tank with a SOG bottle inside and a coating unit of prior art and then SOG is supplied for a time interval from the source tank into the buffer tank by control signals from these level sensors. Besides, the buffer tank is surrounded with a cooling unit to provide a low temperature enviroment allowing for prolonging life time of SOG and preventing organic solvent inside SOG from evaporating and then crystallizing to form contamination particles at wall of the SOG dispensing system. Thus, the resultant SOG dispensing system, according to the present invention, can resolve a shortcoming of discontinuous production of prior art due to a need for changing the SOG bottle, as well as another shortcoming of residue of the SOG bottle, thereby considerably raising operating efficien of the dispensing system by reducing its idle time and lowering fabrication cost by saving a SOG waste.

8 Claims, 1 Drawing Sheet

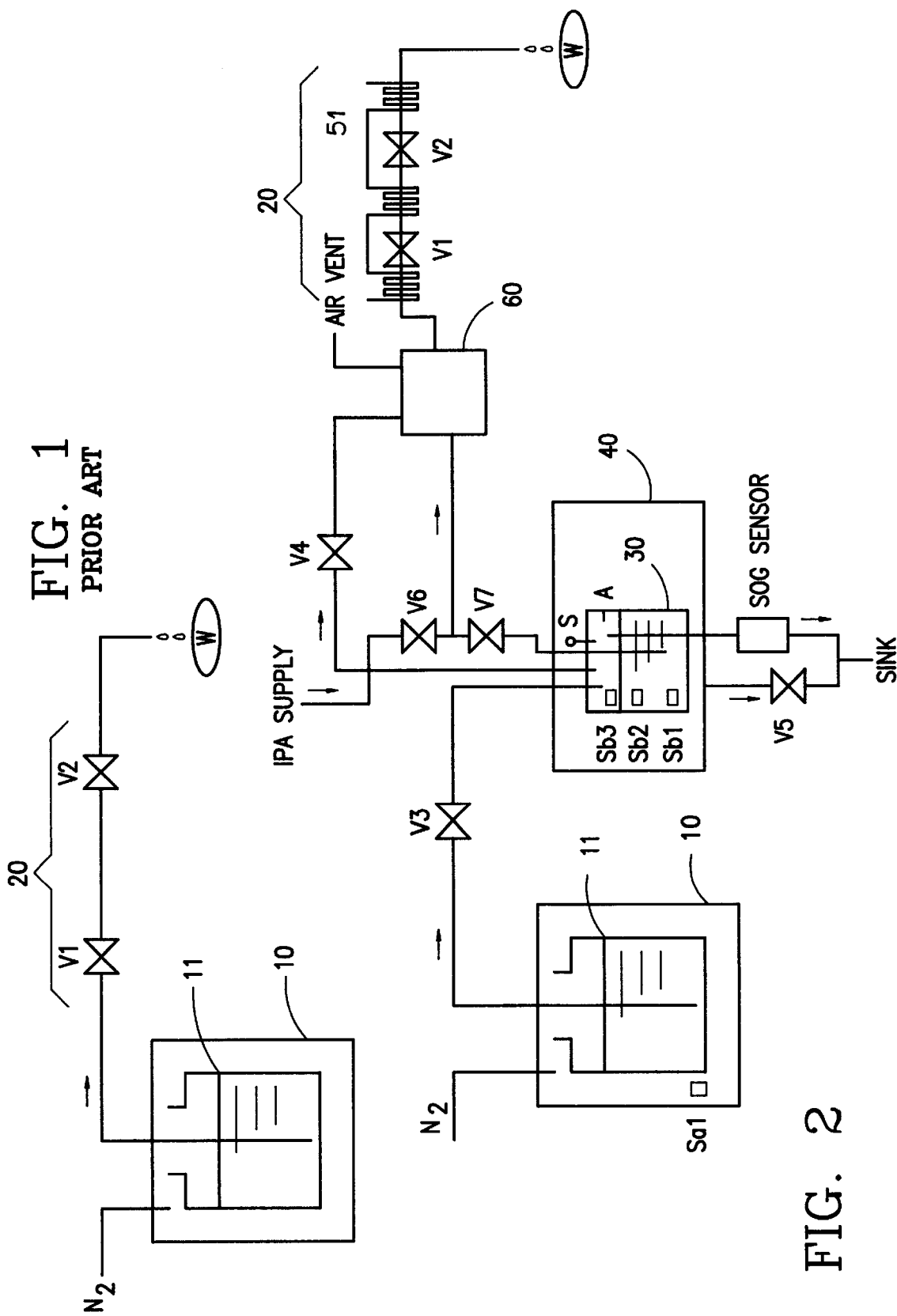

SOG DISPENSING SYSTEM AND ITS CONTROLLING SEQUENCES

BACKGROUND OF THE INVENTION

1. Field of the Invention

The present invention relates to a SOG (Spin-On-Glass, hereinafter referred as SOG) dispensing system and its controlling sequences and, more particularly, to a SOG dispensing system allowing for continuous production and raising its operating efficient.

2. Description of the Prior Art

Before we start to introduce a SOG dispensing system of prior art, it is necessary to explain importance of SOG for a semiconductor device and its fabrication processes. It is well known that uneven (non-planar) surface topology of a wafer can cause undesirable effects and difficulties in the application of subsequent layers and fabrication processes such as pattern distortion after developing due to a focusing problem in a photolithography process, it becoming more serious at a recessed area because of insufficient exposure, Especially at a multilevel metallization structure, an interlevel dielectric (hereinafter referred as ILD ) is not only used as a dielectric layer but a planarizing layer to eliminate voids formed at gaps between metal conduction lines. During a photolithography process, if there are voids formed, photoresist would flow into these voids and thus the thickness of photoresist isn't thick enough to protect the ILD layer during etching process and causes a quality-controlled issue of ILD. Besides, it is hard to clear photoresist inside the voids and thus causes a wafer-contaminated problem so as to reduce production yield. In order to overcome said problem, SOG is dispensed to the wafer for planarizing its surface topology because SOG has a flowing characteristic like a photoresist to fully filling up gaps between metal conduction lines. The wafer is then baked so that organic solvent inside the SOG can be evaporated to make it transform from a fluidity to a solidity.

A SOG dispensing system of prior art, shown in FIG. 1, comprises a source tank 10 in which contains a SOG bottle 11 having a volume 500 cc, and a coating unit 20. The reason why we use the SOG bottle is that life time of SOG chemical is maintained at a temperature between −1° C. and 4° C. and reduced to about 10 days at room temperature so that a SOG bottle is easy to be replaced when used up. Otherwise, a cooling unit is needed to provide low temperature and this is not ecnomical. The coating unit 20 comprises a valve V1 and a valve V2 conncected to the valve V1, wherein the valve V1 is controlled by a timing circuit (not shown in FIG. 1) to dispense a certain amount of SOG to a wafer and the valve V2 is controlled by a detector (not shown in FIG. 1) to suck back residual SOG at nozzle of its output pipe line. SOG is pushed by a high pressure of $N_2$ and transmitted from the SOC bottle 11 through the valve V1, the valve V2 to nozzle of its output pipe line, finally dropping to the wafer W,as shown in FIG. 1. According to practical situation of production line, about 100 cc–200 cc of SOC is left after finishing SOG coating of three lots of wafers (i.e. 150 wafers) and in order to avoid process discontinuity for a next lot of wafers due to insufficient SOC, the residue can't be used and the SOG bottle should be replaced. Thus, the SOG dispensing system must be idle when changing the SOG bottle 11, thereby prolonging fabrication cycle time, as well as raising fabrication cost because of unused residue of the SOG bottle. Since in order to issure that there are no bubbles or particles in these dispensing lines, a dummy dispensing of a test running for particles and thickness confirmation is necessary after changing the SOG bottle, idle time of the SOG dispensing system is further prolonged and thus considerably lowers its operating efficient. Therefore, it is needed to propose a new SOG dispensing system allowing for continuous production, thereby raising its operating efficient and reducing fabrication cost by saving SOG waste .

SUMMARY OF INVENTION

It is therefore an object of the present invention to provide a new SOG dispensing system and its controlling sequences allowing for continuous production.

It is another object of the present invention to provide a new SOG dispensing system and its controlling sequences allowing for raising its operating efficient and reducing fabrication cost by saving SOG waste.

According to the present invention, a buffer tank, whose wall is set a plurality of level sensors at different level heights, is connected between a source tank with a SOG bottle inside and a coating unit of prior art and then SOG is supplied for a time interval from the source tank into the buffer tank by control signals from these level sensors. Besides, the buffer tank is surrounded with a cooling unit to provide a low temperature enviroment allowing for prolonging life time of SOG and preventing organic solvent inside SOG from evaporating and then crystallizing to form contamination particles at wall of the SOG dispensing system. Thus, the resultant SOG dispensing system, according to the present invention, can resolve a shortcoming of discontinuous production of prior art due to a need for changing the SOG bottle, as well as another shortcoming of residue of the SOG bottle, thereby considerably raising operating efficient of the dispensing system by reducing its idle time and lowering fabrication cost by saving a SOG waste.

BRIEF DESCRIPTION OF THE DRAWINGS

The objects, features and advantages of the present invention will become apparent from the following detailed description in which:

FIG. 1 is a SOG dispensing system of prior art.

FIG. 2 is a new SOG dispensing system of the present invention.

DESCRIPTION OF THE FIRST PREFERRED EMBODIMENT

As aforementioned, the SOG bottle is partially expended in a test running for particles and thickness confirmation and then in a real SOG coating process for three lots of wafers (i.e. 150 wafers) so that only about 100 cc of SOG is finally left. Since this 100 cc of SOG is insufficient for a next lot, it can't be used due to its contaminating another SOG bottle and should be thrown away, thereby not only interrupting coating process but increasing expense cost of SOG. In order to overcome these problems, a new SOG dispensing system, according to the present invention, is proposed and its operating principles are that a buffer tank, whose wall is set three level sensors at different level heights, is connected between the source tank and the coating unit of prior art and that said residual SOG of the SOG bottle can be supplied into the buffer tank for a time interval by a control signal from one of these level sensors.

FIG. 2 is a SOG dispensing system of the present invention, wherein a source tank 10 in which contains a SOG bottle 11 having a volume 500 cc, a valve V1, a valve V2, and a wafer W are the same as those of FIG. 1. An input pipe line of the source tank 10 connected to a $N_2$ source and inside the SOG bottle 11 there is an output pipe line connected through a valve V3 to input of following buffer tank. At the bottom of the source tank 10 there is a level sensor Sa1, which can produce an alarm signal to operators when it detects volume of SOG less than 40 cc. A buffer tank 30 having a volume 250 cc, its output pipe line connected through a valve V7 to an input pipe line of following pump, is set three level sensors Sb1, Sb2, Sb3 at its inside wall from low to high in this sequence, each detecting different level heights corresponding to volumes of 50 cc, 100 cc and 200 cc respectively. The valve V3 is opened by a control signal from the level sensor Sb2 for a time interval to supply SOG from the SOG bottle 11 into the buffer tank 30. The three level sensors Sb1, Sb2, Sb3 are used to produce an alarm signal when volume of the buffer tank 30 is below its low limit, a start signal for opening the valve V3 to supply SOG into the buffer tank 30, and an alarm signal when volume of the buffer tank 30 is above its high limit respectively. Surely, volumes detected by these three level sensors can be regulated by a designer's need rather than aforementioned.

A cooling unit 40 is used to surround the buffer tank 30 to control its temperature between –1° C. and 4° C., thereby noy only preventing organic solvent inside SOG of the buffer tank 30 from evaporating and then crystallizing to form contamination particles at wall of the SOG dispensing system, but prolonging life time of SOG chemical.

A pump 60, its input pipe line connected through a valve V7 to the buffer tank 30 and its output pipe line connected to input pipe line of the valve V1, is used to transmit SOG from the buffer tank 30 to following coating unit 20 rather than a high $H_2$ pressure of the prior art. According to the present invention, in order to allow SOG transmitting from the SOG bottle 11 to the buffer tank 30, its pressure should be maintained lower than that of the SOG bottle 11, while input pipe line of the source tank 10 is supplied with a high $N_2$ pressure. Besides, the pump 60 has another input pipe line connected through a valve V4 to top of the buffer tank 30, where a pressure sensor S is also set to monitor pressure thereof. If the pressure sensor S detects a pressure higher than 3 atm, it will then produce a signal to open the valve V4 allowing venting air from inside the buffer tank 30 to another output pipe line of the pump 60, where an air vent unit is set therein(not shown in FIG. 2), to reduce this pressure until it detects the pressure less than 1 atm.

The coating unit 20 comprises a heating device 51, surrounding a segment of pipe line from input of valve V1 to output of valve V2 so as to allow for raising temperature of SOG therein from low temperature to room temperature, a valve V1 controlled by a timing circuit (not shown in FIG. 2) to dispense a certain amount of SOG to a wafer, and a valve V2 controlled by a detector(not shown in FIG. 2) to suck back residual SOG at the nozzle of its output pipe line, wherein input and output pipe lines of the valve V1 are connected to output pipe line of the pump and input pipe line of the valve V2 respectively and the heating device 51 is substantially a pipe coil filled with cooling water(23° C.) Thus, the certain amount of SOG will drop from nozzle of output pipe line of the valve V2 to the wafer.

Controlling sequences of the SOG dispensing system allowing for continuous production, according to the present invention, comprising following steps:

1. When level height of the buffer tank 30 lowers below that of volume 100 cc and is detected by the level sensors Sb2, it will produce a signal to open the valve V3 and then SOG of the SOG bottle 11 is transmitted through the valve V3 into the buffer tank 30 at a flow rate of 1 cc per second for 50 seconds. If an accident situation that the valve V3 is out of control happens so that SOG continues to supply into the buffer tank 30 to making its volume higher than 200 cc, the level sensor Sb3 will produce an alarm signal to warn operators to handle it. By the same reason, the level sensor Sb1 is arranged at bottom of the buffer tank 30 to produce an alarm signal when it detects volume of SOG less than 50 cc.

2. When SOG of the SOG bottle 11 is expended to its volume less than 40 cc, the level sensor Sa1 will produce a signal and continue to open the valve V3 for 50 seconds so that the residue of the SOG bottle 11 is completely transmitted to the buffer tank 30. An alarm signal is then produced by the level sensor Sa1 to warn operators to replace a new SOG bottle. The SOG dispensing system still continues to run while changing the new SOG bottle because of the coating SOG supplied from the buffer tank 30 not from the SOG bottle 11.

3. The valve V3 open 50 seconds for each time and its output flow rate is 1 cc per second so that the SOG bottle 11 with a volume 500 cc can supply SOG to the buffer tank 30 only 10 times, each time of 50 cc volume.

4. As aforesaid, the cooling unit 40 is used to surround the buffer tank 30 to control its temperature between –1° C. and 4° C. for not only keeping SOG fresh but reducing its vapor and contamination particles formed by crystallization of SOG vapor. Besides, a heating device 51 of the coating unit 20 is a pipe coil filled with cooling wafer (23° C.) and allows for raising temperature of SOG inside pipe lines from low temperature to room temperature.

5. As aforesaid, the pressure sensor S, positioned at top of the buffer tank 30, is used to keep its pressure between 3 atm and 1 atm, thereby SOG of the SOG bottle 11 can be transmitted into the buffer tank 30 by their pressure difference. As to how to reduce a pressure of the buffer tank 30, it is realized by opening the valve V4 until the pressure sensor S detects the pressure less than 1 atm.

In addition to said SOG dispensing system, the new SOG dispensing system, according to the present invention, further includes a periodic maintenance system to assure that the system is always kept at optimal condition. The periodic maintenance system comprises the following connecting structures. The bottom of the buffer tank 30 is connected through a valve V5 to a sink and when maintaining it, the valve V5 is first opened to allow its residue drained by the sink and then takes it off to clean. Besides, a pipe line having its nozzle at a height A higher than that of the level sensor Sb3, is connected through a SOG sensor to the sink so that any SOG whose height is over A will flow from the nozzle of the pipe line, passing through the SOG sensor which produces an alarm signal as soon as detecting any SOG, to the sink. Thus, it can be prevented that too much SOG will flow into the buffer tank 30 in case of out control of the valve V3. Besides, At a region between input of the pump 60 and output of the valve V7 there is a pipe line connected through a valve V6 to an IPA supply so that back-end pipe lines of the dispensing system can be purged by flowing of IPA after closing the valve V7 and opening the valve V6. After that, assemblying the cleaned buffer tank 30 and changing the SOG bottle 11 with IPA, a purge process then proceeds to clean the whole dispensing pipe lines before a SOG coating starts and comprises the following steps: first opening the valve V7 and closing the valve V6, followed by opening the pump 60 so that IPA will pass through the whole dispensing pipe lines and comes out from the nozzle of output pipe line of the valve V2, finally droping to a test wafer (not a real product wafer). Datas of particle numbers and coating thickness measured from the several test wafers are used to assure that the dispensing sytem is maintained at optimal condition.

Compared with the dispensing system of prior art, the present invention has following advantages:
1. The SOG bottle will be totally expended, according to the present invention, rather than about 100 cc SOG waste of prior art, and SOG itself is expensive so that fabrication cost can be reduced by considerably saving SOG expense.
2. Since wafers continue to run by supplying SOG from the buffer tank, not from the SOG bottle of prior art, when changing a new SOG bottle, the SOG dispensing system allows for continuous production rather than discontinuous production of prior art. Only in a periodic maintenance has the SOG dispensing system to stop running, according to the present invention, so that its operating efficient can be condsiderably raised, thereby further reducing fabrication cost.

While particular embodiment of the present invention has been illustrated and described, it would be obvious to those skilled in the art that various other changes and modifications can be made with departing from the spirit and scope of the invention. It is therefore intended to cover in the appened claim all such changes and modifications that are within the scope of the present invention.

What is claimed is:

1. A SOG dispensing system allowing for continuous production comprises;

a source tank containing a SOG bottle having its input pipe line connected to a $N_2$ source and inside the SOG bottle setting an output pipe line connected through a valve (V3) to input pipe line of following buffer tank;

a buffer tank with its output pipe line connected through a valve (V7) to an input pipe line of following pump and inside wall thereof set three level sensors (Sb1, Sb2, Sb3) from low to high in this sequence, each detecting different level heights corresponding to their different volumes and then producing an alarm signal when volume of the buffer tank is below its low limit, a start signal for opening the valve (V3) to supply SOG into the buffer tank, and an alarm signal when volume of the buffer tank is above its high limit respectively;

a pump with its output pipe line connected to input pipe line of following valve (V1) and another input pipe line connected through a valve (V4) to the top of the buffer tank;

a pressure sensor, positioned at top and inside the buffer tank, producing a signal to open the valve (V4) allowing venting air from the top of the buffer tank to another output pipe line of the pump to reduce pressure of the buffer tank;

a cooling unit surrounding the buffer tank to control its temperature between −1° C. and 4° C.; and a coating unit comprising a heating device, surrounding a segment of pipe line from input of valve (V1) to output of valve (V2) so as to allow for raising temperature of SOG therein from low temperature to room temperature, a valve (V1) controlled by a timing circuit to dispense a certain amount of SOG to a wafer, and a valve (V2) controlled by a detector to suck back residual SOG at the nozzle of its output pipe line, wherein input and output pipe lines of the valve (V1) are connected to output pipe line of the pump and input pipe line of the valve (V2) respectively.

2. The system of claim 1, wherein the bottom of the buffer tank is connected through a valve (V5) to a sink.

3. The system of claim 1, wherein inside the buffer tank there is further added a pipe line having its nozzle at a height (A) higher than that of the level sensor (Sb3), and connected through a SOG sensor to a sink, thereby any SOG whose height is over (A), which will make the SOG sensor produce an alarm signal, flowing from the nozzle of the pipe line, passing through the SOG sensor, to the sink so as to prevent from too much SOG supplied into the buffer tank in case of out control of the valve (V3).

4. The system of claim 1, wherein at the region between input of the pump and output of the valve (V7) there is further added a pipe line connected through a valve (V6) to an IPA supply so that back-end pipe lines of the dispensing system can be purged by flowing of IPA after closing the valve (V7) and opening the valve (V6).

5. The system of claim 1, wherein level heights detected by the three level sensors are corresponding to volumes of 50 cc, 10 cc, and 200 cc respectively.

6. The system of claim 1, wherein volumes of the SOG bottle and the buffer tank are 500 cc and 250 cc respectively.

7. The system of claim 1, wherein the cooling unit is a thermoelectric cooler.

8. The system of claim 1, wherein the heating device is a pipe coil filled with cooling water at 23° C.

* * * * *